United States Patent
Kimura et al.

(10) Patent No.: US 6,794,680 B2
(45) Date of Patent: Sep. 21, 2004

(54) SEMICONDUCTOR DEVICE HAVING PAD

(75) Inventors: Naoki Kimura, Hyogo (JP); Keiji Sugihara, Tokyo (JP)

(73) Assignees: Renesas Technology Corp., Tokyo (JP); Kyoei Sangyo Co., Ltd., Tokyo (JP)

(*) Notice: Subject to any disclaimer, the term of this patent is extended or adjusted under 35 U.S.C. 154(b) by 0 days.

(21) Appl. No.: 10/612,066

(22) Filed: Jul. 3, 2003

(65) Prior Publication Data

US 2004/0140467 A1 Jul. 22, 2004

(30) Foreign Application Priority Data

Jan. 22, 2003 (JP) ........................................ 2003-013766

(51) Int. Cl.$^7$ ............................................. H01L 23/58
(52) U.S. Cl. ......................................... 257/48; 257/459
(58) Field of Search ..................... 257/48, 459; 438/11, 438/14, 18

(56) References Cited

U.S. PATENT DOCUMENTS 4,751,458 A * 6/1988 Elward, Jr. .................. 324/754

FOREIGN PATENT DOCUMENTS

| JP | 1-128535 | 5/1989 |
| JP | 8-115960 | 5/1996 |

* cited by examiner

Primary Examiner—Thien F Tran
(74) Attorney, Agent, or Firm—McDermott Will & Emery LLP

(57) ABSTRACT

In a semiconductor device having a pad, a first conductor and a second conductor are arranged at a surface of the pad. The first conductor has hardness that is greater than that of the second conductor and not less than that of a probe stylus. The first conductor is arranged at the surface of the pad such that the probe stylus hits or rubs against the first conductor at least one time while the probe stylus is in contact with and sliding on the surface of the pad.

6 Claims, 4 Drawing Sheets

SEMICONDUCTOR DEVICE HAVING PAD

BACKGROUND OF THE INVENTION

1. Field of the Invention

The present invention relates to a semiconductor device having a pad, and more particularly to a semiconductor device having a pad with which a terminal is brought into contact upon inspection or measurement of electric properties of a semiconductor element.

2. Description of the Background Art

A probe card having a plurality of probe styluses disposed thereon has been employed for inspection of electric properties of a semiconductor element in a wafer state. The probe card is disclosed, e.g., in Japanese Patent Laying-Open No. 1-128535.

Upon the inspection of electric properties, a probe stylus of the probe card is pressed against the pad to achieve electrical conduction between the semiconductor element and a tester. The probe stylus is configured to touch the pad surface at a prescribed angle other than a right angle. Thus, after establishment of contact between the probe stylus and the pad, as the wafer is further moved toward the probe card, the tip end of the probe stylus slides on the pad surface. As the wafer is stopped in position, the slide of the probe stylus on the pad surface also stops.

Generally, the pad has aluminum as its primary component, and aluminum oxide exists on the pad surface. The probe stylus is generally formed of tungsten which is harder than aluminum. Thus, as the probe stylus in contact with the pad slides on the pad surface, the tip end of the probe stylus scribes the aluminum oxide thereon. This causes the tip end of the probe stylus to contact non-oxidized aluminum in the interior, making the probe stylus and the pad electrically conducting with each other at low resistance.

As the tip end of the probe stylus scribes aluminum oxide on the pad surface, pad shavings, such as scribed aluminum, aluminum oxide and others, are attached to the probe stylus. Such pad shavings attached to the tip end of the probe stylus would cause electric resistance upon the inspection and/or measurement of electric properties, thereby adversely affecting the results thereof. Thus, in a mass-production wafer test, probe styluses have been cleaned or polished regularly upon wafer or lot replacement, causing an increase of the wafer test processing time, wearing of the tip ends of the probe styluses due to polishing, breaking of the tip ends during cleaning, and others problems.

SUMMARY OF THE INVENTION

The present invention has been made to solve the above-described problems, and its object is to provide a semiconductor device having a pad which eliminates the need for cleaning or polishing a probe stylus.

A semiconductor device having a pad according to the present invention is a semiconductor device having a pad with which a terminal is brought into contact upon inspection or measurement of electric properties of a semiconductor element. First and second conductors are arranged at a surface of the pad. The first conductor has hardness that is greater than that of the second conductor and not less than that of the terminal. The first conductor is arranged at the surface of the pad such that the terminal in contact with and sliding on the pad surface hits against the first conductor at least one time.

According to the semiconductor device having a pad of the present invention, pad shavings attached to the tip end of the terminal are removed as it comes up against the first conductor, making it unnecessary to regularly clean or polish the terminal upon wafer or lot replacement. In addition, the wafer test processing time required for the cleaning or polishing can be saved. Further, wearing of the tip end of the terminal due to polishing as well as breaking of the terminal due to the polishing or cleaning work can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
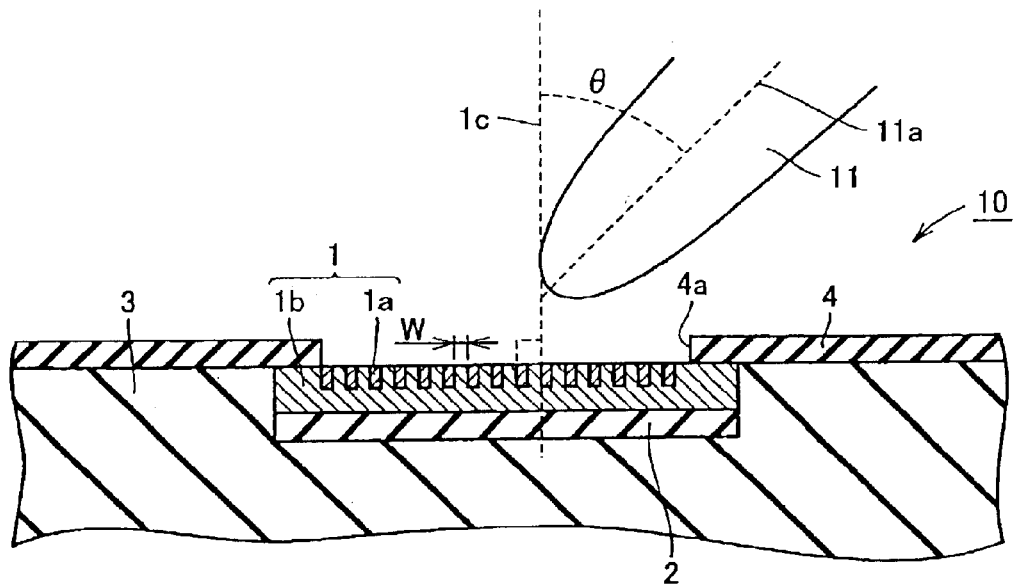
FIGS. 1 and 2 are a cross sectional view and a top plan view, respectively, schematically showing a configuration of a semiconductor device having a pad according to a first embodiment of the present invention.
Figure 2:
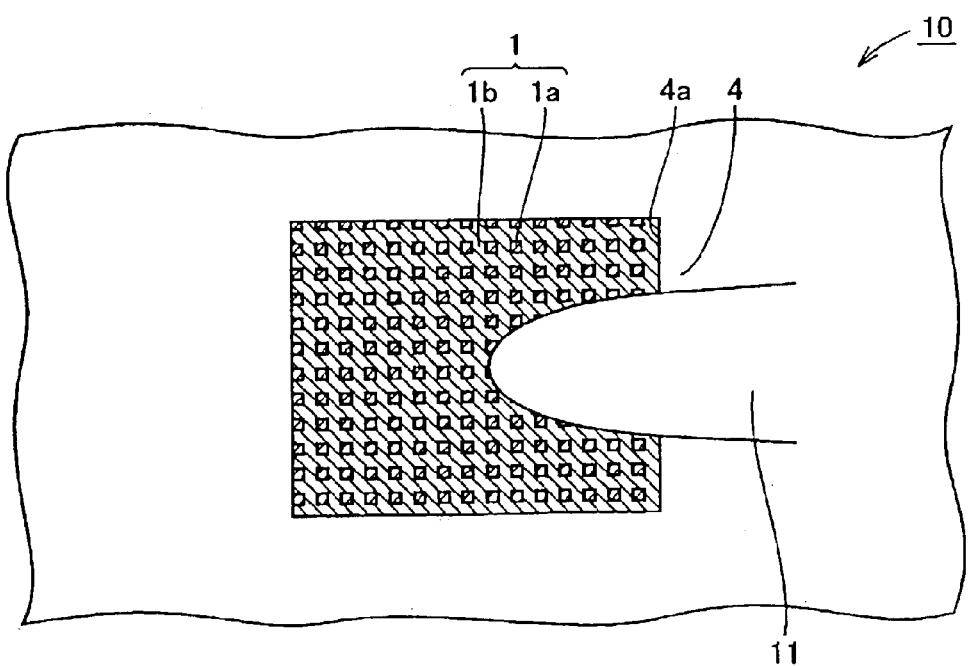

Referring to FIGS. 1 and 2, the semiconductor device (e.g., semiconductor wafer) 10 according to the present embodiment has a pad 1, an underlayer 2, an insulating layer 3, and a glass coat 4.

Pad 1 is electrically connected to a semiconductor element formed in semiconductor wafer 10, and is arranged on underlayer 2. Underlayer 2 is formed of an insulative material such as silicon nitride film, silicon oxide film or the like. Insulating layer 3 is formed on the periphery of pad 1. Glass coat 4 is formed of an insulative material, and is formed at a surface of semiconductor wafer 10. The glass coat has an opening 4a from which a portion of the surface of pad 1 is exposed.

A probe stylus (terminal) 11 is pressed against pad 1 upon inspection or measurement of electric properties of the semiconductor element. A first conductor 1a and a second conductor 1b are arranged at the surface of pad 1. First conductor 1a has hardness that is greater than that of second conductor 1b and not lower than that of probe stylus 11.

First conductor 1a is formed of any of tungsten (W), tungsten alloy, titanium (Ti) alloy, rhenium (Re), nickel (Ni) and nickel alloy, for example, or an arbitrary combination thereof. As such, the material can be selected as appropriate.

First conductor 1a is preferably formed of the same component material (e.g., tungsten) with probe stylus 11. Second conductor 1b is formed of aluminum (Al), for example, or a material containing aluminum.

First conductor 1a is arranged on the surface of pad 1 such that probe stylus 11 hits against first conductor 1a at least one time while it is in contact with the pad surface and is sliding thereon. In the present embodiment, pad 1 has second conductor 1b as its main body, and a plurality of first conductors 1a are arranged in the form of an array at the surface of second conductor 1b.

First conductors 1a are filled in holes provided at the surface of second conductor 1b, with the surface of each first conductor 1a being approximately equal in height to the surface of second conductor 1b. Portions of first conductors 1a exposed at the surface of pad 1 each have a dimension sufficiently small compared to the tip end diameter of probe stylus 11.

Herein, arrangement of first conductors 1a in the form of an array means that a plurality of first conductors 1a are arranged regularly in rows and columns at the surface of pad 1.

Description is now made as to how the probe stylus contacts the pad.

Figure 3:
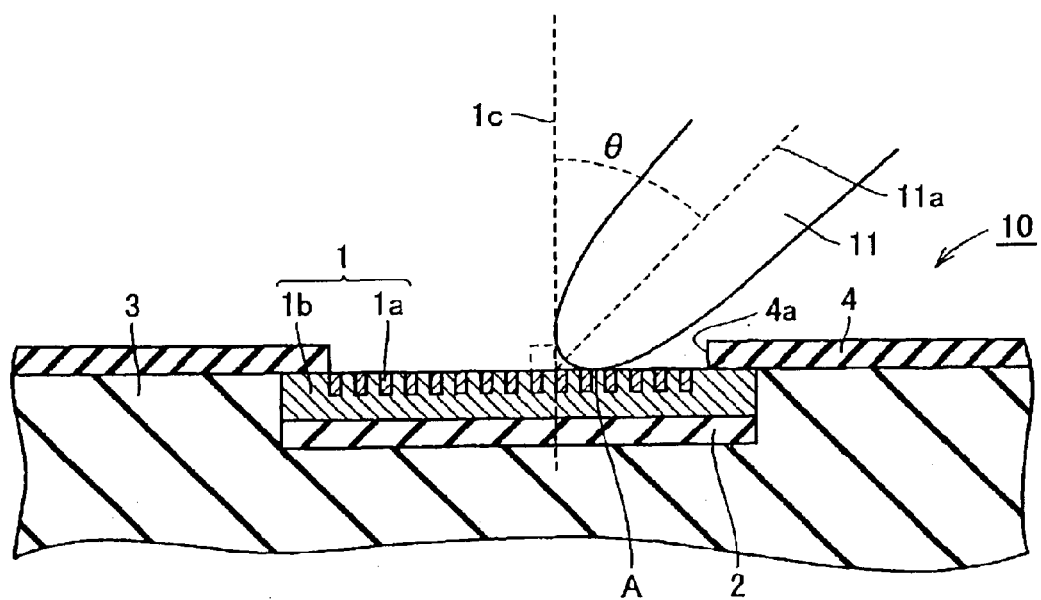
FIGS. 3 and 4 are first and second cross sectional views of the semiconductor device having a pad of the first embodiment, illustrating how a probe stylus contacts the pad.

Referring to FIG. 3, semiconductor wafer 10 is moved in an upper direction on the plane of the drawing, along a vertical line 1c (phantom line perpendicular to the main surface of semiconductor wafer 10), to achieve electrical conduction between probe stylus 11 and pad 1. Consequently, probe stylus 11 first comes into contact with pad 1 at a point A. Thereafter, generally, semiconductor wafer 10 is moved further in the upper direction of the drawing along vertical line 1c, to prevent loose connection between probe stylus 11 and pad 1.

Figure 4:
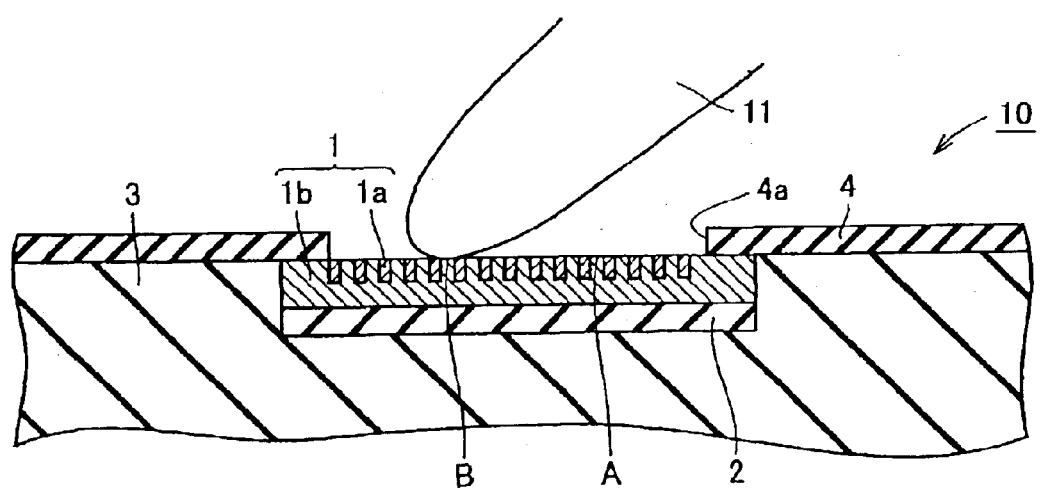

Probe 11 is sufficiently long, and contacts the surface of pad 1 at a certain angle (forming an angle θ with respect to vertical line 1c). Thus, in accordance with the movement of semiconductor wafer 10, probe stylus 11 slides, while flexing, on the surface of pad 1 to a point B in FIG. 4. At this time, probe stylus 11 scribes aluminum oxide, for example, at the surface of second conductor 1b as it slides thereon, so that pad shavings of aluminum oxide or the like are attached to the tip end of probe stylus 11. First conductors 1a, however, are arranged such that probe stylus 11 comes up against first conductor 1a at least one time while it slides on the surface of pad 1, and also first conductor 1a has hardness not lower than that of probe stylus 11. Thus, the pad shavings attached to the tip end of probe stylus 11 are removed when probe stylus 11 hits against first conductor 1a. Accordingly, probe stylus 11 and pad 1 come in contact at low resistance and hence become conductive with each other.

The amount of sliding of probe stylus 11 on the pad 1 surface, which can be adjusted by a tilt angle θ, length of probe stylus 11 and others, is generally on the order of 30–50 μm. In this case, a distance W between neighboring first conductors 1a may be set not to exceed 20 μm, for example.

According to the present embodiment, pad shavings attached to the tip end of probe stylus 11 are removed as probe stylus 11 rubs against first conductor 1a, so that it is unnecessary to regularly clean or polish probe stylus 11 upon wafer or lot replacement. Further, the wafer test processing time required for the cleaning or polishing can be saved. Wearing of the tip end of probe stylus 11 due to polishing as well as breaking of probe stylus 11 due to the polishing or cleaning work can also be prevented.

Second Embodiment

Figure 5:
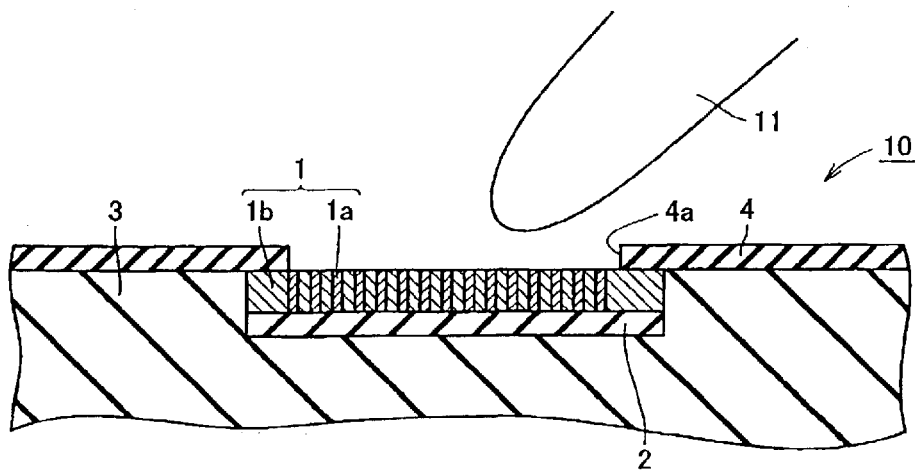
FIG. 5 is a cross sectional view schematically showing a configuration of a semiconductor device having a pad according to a second embodiment of the present invention.

Referring to FIG. 5, the configuration of the semiconductor device according to the present embodiment differs from that of the first embodiment in that first conductors 1a extend to reach the lower surface of pad 1.

Otherwise, the configuration of the present embodiment is substantially the same as that of the first embodiment, and thus, the same elements are denoted by the same reference characters and description thereof is not repeated.

The present embodiment can enjoy the same effects as in the first embodiment.

Third Embodiment

Figure 6:
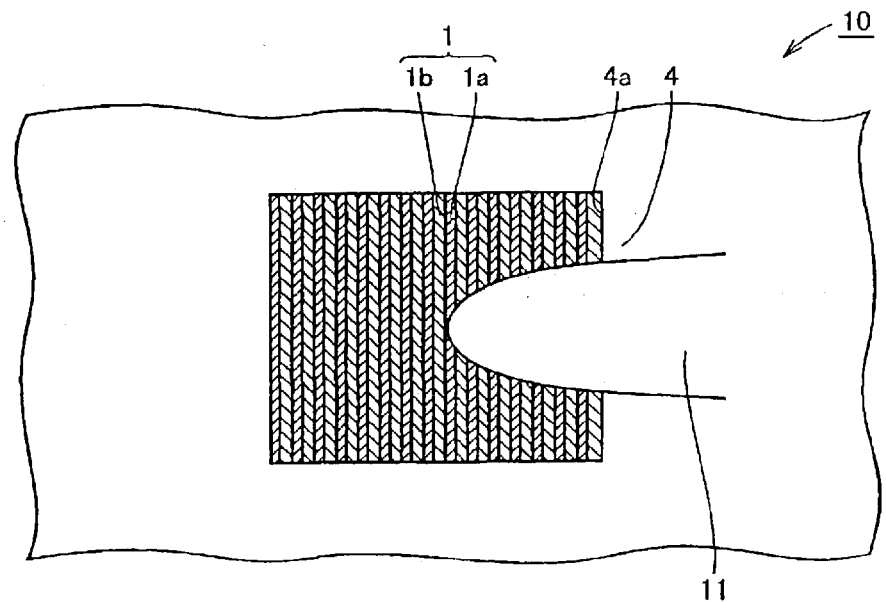
FIG. 6 is a top plan view schematically showing a configuration of a semiconductor device having a pad according to a third embodiment of the present invention.

Referring to FIG. 6, the configuration of the semiconductor device according to the present embodiment differs from that of the first embodiment in that first conductors 1a are arranged in the form of slits at the surface of pad 1.

Herein, arrangement in the form of slits means that a plurality of first conductors 1a are arranged in narrow rectangular shapes at the surface of pad 1. Here, each first conductor 1a has a width L of not greater than a half of the sliding amount of probe stylus 11.

Otherwise, the configuration of the present embodiment is substantially the same as that of the first embodiment. Therefore, the same elements are denoted by the same reference characters, and description thereof is not repeated.

The present embodiment can also enjoy the same effects as in the first embodiment.

Fourth Embodiment

Figure 7:
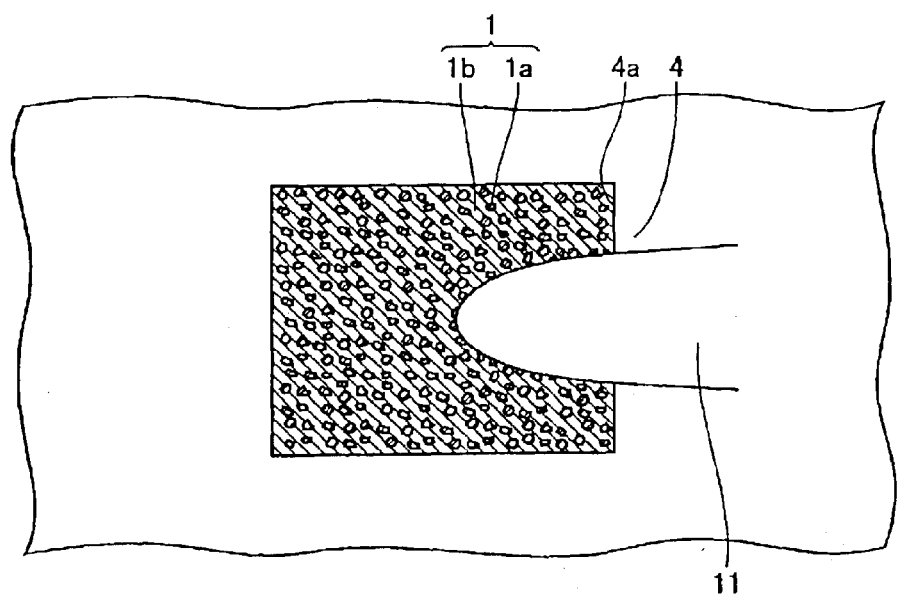
FIG. 7 is a top plan view schematically showing a configuration of a semiconductor device having a pad according to a fourth embodiment of the present invention.

Referring to FIG. 7, the configuration of the semiconductor device according to the present embodiment differs from that of the first embodiment in that first conductors 1a are distributed at random over the entire surface of pad 1.

Otherwise, the configuration of the present embodiment is substantially identical to that of the first embodiment, and therefore, the same elements are denoted by the same reference characters, and description thereof is not repeated.

The present embodiment again enjoys the same effects as in the first embodiment.

Fifth Embodiment

Figure 8:
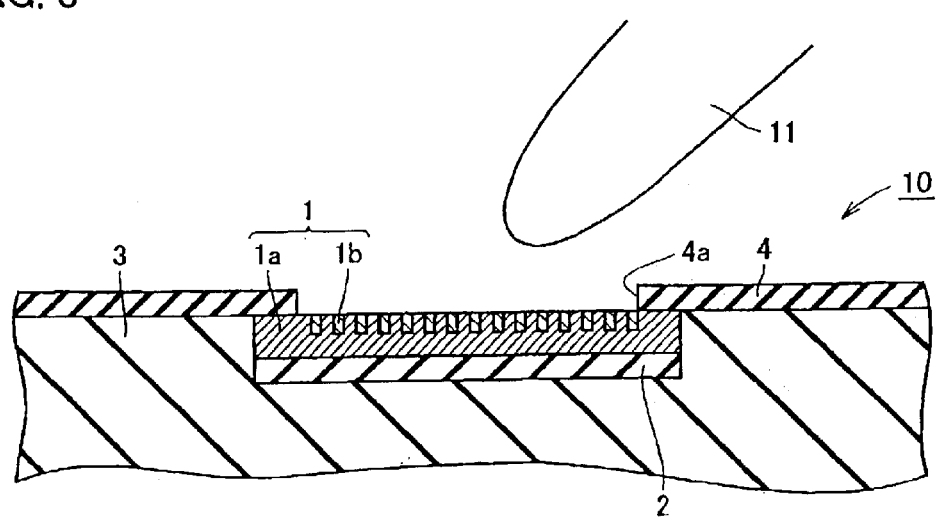
FIG. 8 is a cross sectional view schematically showing a configuration of a semiconductor device having a pad according to a fifth embodiment of the present invention.

Referring to FIG. 8, the configuration of the semiconductor device according to the present embodiment differs from that of the first embodiment in that pad 1 has first conductor 1a as its main body and second conductor 1b is arranged at the surface of first conductor 1a.

In this configuration, again, first conductor 1a is arranged such that probe stylus 11 comes up against first conductor 1a at least one time while probe stylus 11 in contact with the surface of pad 1 slides thereon. A plurality of second conductors 1b may be arranged in the form of an array, in the form of slits, or distributed at random, as described above.

Otherwise, the configuration of the present embodiment is substantially the same as that of the first embodiment, and thus, the same elements are denoted by the same reference characters and description thereof is not repeated.

The present embodiment can also enjoy the same effects as in the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a pad with which a terminal is brought into contact upon inspection or measurement of electric properties of a semiconductor element, wherein a first conductor and a second conductor are arranged at a surface of said pad, said first conductor has hardness that is greater than hardness of said second conductor and not lower than hardness of said terminal, and said first conductor is arranged at the surface of said pad such that said terminal hits against said first conductor at least one time while said terminal is in contact with and sliding on the surface of said pad.

2. The semiconductor device having a pad according to claim 1, wherein a plurality of said first conductors are arranged in the form of an array at the surface of said pad.

3. The semiconductor device having a pad according to claim 1, wherein a plurality of said first conductors are arranged in the form of slits at the surface of said pad.

4. The semiconductor device having a pad according to claim 1, wherein a plurality of said first conductors are distributed at random over the surface of said pad.

5. The semiconductor device having a pad according to claim 1, wherein said pad has said first conductor as its main body, and said second conductor is arranged at a surface of said first conductor.

6. The semiconductor device having a pad according to claim 1, wherein said first conductor is formed of a material containing at least one kind selected from a group consisting of tungsten, tungsten alloy, titanium alloy, rhenium, nickel and nickel alloy, and said second conductor is formed of a material containing aluminum.

* * * * *